United States Patent
Lim et al.

(10) Patent No.: US 12,464,833 B2
(45) Date of Patent: Nov. 4, 2025

(54) AVALANCHE PHOTODETECTORS WITH A COMBINED LATERAL AND VERTICAL ARRANGEMENT

(71) Applicant: GlobalFoundries Singapore Pte. Ltd., Singapore (SG)

(72) Inventors: Khee Yong Lim, Singapore (SG); Kian Ming Tan, Singapore (SG); Kiok Boone Elgin Quek, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 518 days.

(21) Appl. No.: 17/984,564

(22) Filed: Nov. 10, 2022

(65) Prior Publication Data
US 2024/0162365 A1 May 16, 2024

(51) Int. Cl.
*H10F 30/225* (2025.01)
*H10F 71/00* (2025.01)
*H10F 77/122* (2025.01)
*H10F 77/20* (2025.01)

(52) U.S. Cl.
CPC ....... *H10F 30/2255* (2025.01); *H10F 71/121* (2025.01); *H10F 77/122* (2025.01); *H10F 77/206* (2025.01)

(58) Field of Classification Search
CPC .. H10F 30/2255; H10F 30/225; H10F 71/121; H10F 71/00; H10F 77/122; H10F 77/206
See application file for complete search history.

(56) References Cited

U.S. PATENT DOCUMENTS

| | | | |
|---|---|---|---|
| 6,707,075 B1 * | 3/2004 | Rogers | H10F 71/121 257/E27.128 |
| 8,445,992 B2 | 5/2013 | Hsin et al. | |
| 8,723,221 B2 | 5/2014 | Na et al. | |
| 9,391,225 B1 | 7/2016 | Davids et al. | |
| 9,490,385 B2 | 11/2016 | Huang et al. | |
| 10,411,149 B2 | 9/2019 | Novack et al. | |

(Continued)

OTHER PUBLICATIONS

Son, Bongkwon & Lin, Yiding & Lee, Kwang & Chen, Qimiao & Tan, Chuan. (2020). "Dark current analysis of germanium-on-insulator vertical p-i-n photodetectors with varying threading dislocation density." Journal of Applied Physics. 127. 203105. 10.1063/5.0005112.

(Continued)

*Primary Examiner* — Sitaramarao S Yechuri
(74) *Attorney, Agent, or Firm* — Thompson Hine LLP; Anthony Canale

(57) ABSTRACT

Structures for an avalanche photodetector and methods of forming a structure for an avalanche photodetector. The structure comprises a substrate having a first conductivity type, a first semiconductor layer that defines an absorption region of the avalanche photodetector, a dielectric layer between the first semiconductor layer and the substrate, a charge control region comprising a semiconductor material having a second conductivity type opposite to the first conductivity type and a different bandgap from the first semiconductor layer, and a second semiconductor layer that extends through the dielectric layer from the charge control region to the substrate. The second semiconductor layer defines a multiplication region of the avalanche photodetector.

20 Claims, 4 Drawing Sheets

(56) References Cited

U.S. PATENT DOCUMENTS

| | | | |
|---|---|---|---|
| 2007/0152289 A1 | 7/2007 | Morse et al. | |
| 2010/0271108 A1* | 10/2010 | Sanfilippo | H10F 77/241 |
| | | | 257/438 |
| 2016/0155884 A1 | 6/2016 | Hon et al. | |
| 2019/0288026 A1* | 9/2019 | Von Kaenel | H10F 39/1892 |
| 2021/0391488 A1* | 12/2021 | Huang | H10F 30/221 |

OTHER PUBLICATIONS

Y. Kang, M. Zadka, S. Litski, G. Sarid, M. Morse, M. J. Paniccia, Y.-H. Kuo, J. Bowers, A. Beling, H.-D. Liu, D. C. McIntosh, J. Campbell, and A. Pauchard, "Epitaxially-grown Ge/Si avalanche photodiodes for 1.3 μm light detection," Optics Express 16, 9365-9371 (2008).

Chen, Xiaochi & Huo, Yijie & Cho, Seongjae & Park, Byung-Gook & Harris, James. (2014). "Surface Treatment of Ge Grown Epitaxially on Si by Ex-Situ Annealing for Optical Computing by Ge Technology." IEIE Transactions on Smart Processing and Computing. 3. 331-337. 10.5573/IEIESPC.2014.3.5.331.

C. Li, C. Xue, X. Guo and Z. Liu, "Research of High Performance Ge/Si Avalanche Photodiodes for Single-Photon Detection," 2014 Asia Communications and Photonics Conference (ACP), Shanghai, China, 2014, pp. 1-3.

European Patent Office, Extended European Search Report and Opinion issued in European Patent Application No. 23202870.4 on Apr. 5, 2024; 8 pages.

\* cited by examiner

AVALANCHE PHOTODETECTORS WITH A COMBINED LATERAL AND VERTICAL ARRANGEMENT

BACKGROUND

The disclosure relates to semiconductor device fabrication and integrated circuits and, more specifically, to structures for an avalanche photodetector and methods of forming a structure for an avalanche photodetector.

An avalanche photodetector, also known as an avalanche photodiode, is a highly-sensitive semiconductor photodetector that relies upon the photoelectric effect to convert light into countable current pulses. By applying a high reverse bias voltage that is less than the breakdown voltage, an avalanche photodetector exhibits an internal current gain effect because of impact ionization that multiplies the number of electron-hole pairs to produce an avalanche effect.

Improved structures for an avalanche photodetector and methods of forming a structure for an avalanche photodetector are needed.

SUMMARY

In an embodiment of the invention, a structure for an avalanche photodetector is provided. The structure comprises a substrate having a first conductivity type, a first semiconductor layer that defines an absorption region of the avalanche photodetector, a dielectric layer between the first semiconductor layer and the substrate, a charge control region comprising a semiconductor material having a second conductivity type opposite to the first conductivity type and a different bandgap from the first semiconductor layer, and a second semiconductor layer that extends through the dielectric layer from the charge control region to the substrate. The second semiconductor layer defines a multiplication region of the avalanche photodetector.

In an embodiment of the invention, a method of forming a structure for an avalanche photodetector is provided. The method comprises providing a substrate having a first conductivity type, a first semiconductor layer, and a dielectric layer between the first semiconductor layer and the substrate, patterning the first semiconductor layer to define an absorption region of the avalanche photodetector, forming a charge control region comprising a semiconductor material having a second conductivity type opposite to the first conductivity type and a different bandgap from the first semiconductor layer, and forming a second semiconductor layer extending through the dielectric layer from the charge control region to the substrate. The second semiconductor layer defines a multiplication region of the avalanche photodetector.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
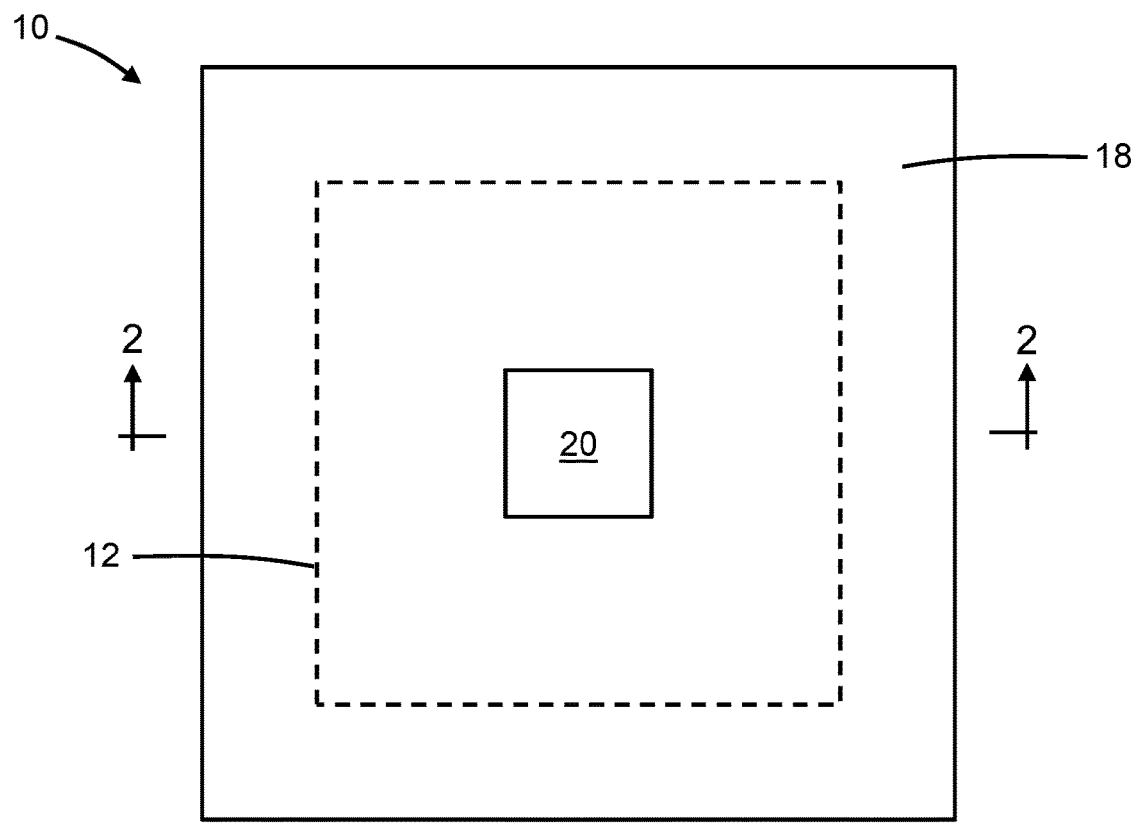
FIG. 1 is a top view of a structure at an initial fabrication stage of a processing method in accordance with embodiments of the invention.
Figure 2:
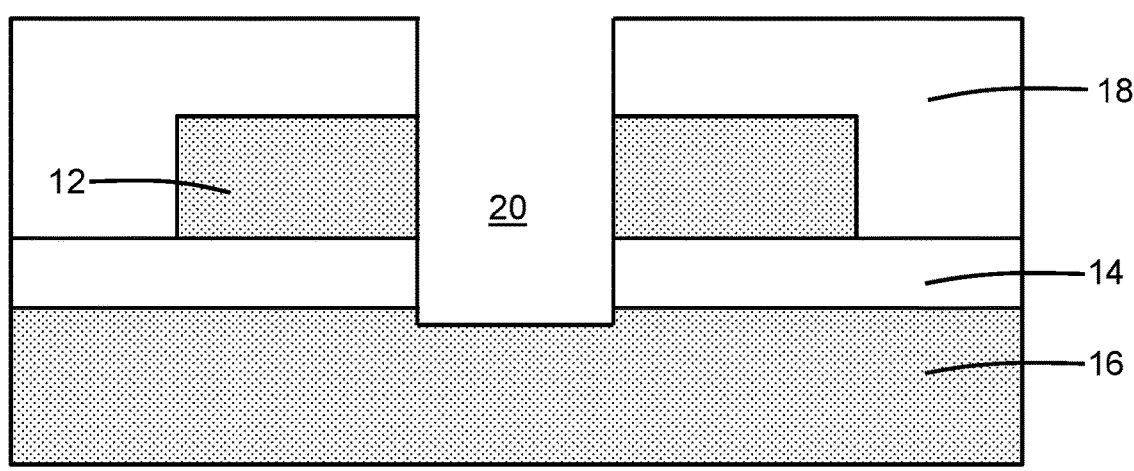
FIG. 2 is a cross-sectional view taken generally along line 2-2 in FIG. 1.

With reference to FIGS. 1, 2 and in accordance with embodiments of the invention, a structure 10 for an avalanche photodetector may be formed using a semiconductor layer 12, a dielectric layer 14, and a substrate 16, which are arranged in a layer stack with the dielectric layer 14 between the semiconductor layer 12 and the substrate 16. The semiconductor layer 12 is separated from the substrate 16 by the intervening dielectric layer 14 and is considerably thinner than the substrate 16. The semiconductor layer 12 may be comprised of a semiconductor material, such as single-crystal germanium, and may be undoped and intrinsic. The substrate 16 may be comprised of a semiconductor material, such as single-crystal silicon, and the dielectric layer 14 may be comprised of a dielectric material, such as silicon dioxide. The dielectric layer 14 may directly contact the substrate 16 along a lower interface, the dielectric layer 14 may directly contact the semiconductor layer 12 along an upper interface, and the lower and upper interfaces may be separated by the thickness of the dielectric layer 14. The semiconductor layer 12 may be electrically isolated from the substrate 16 by the dielectric layer 14. In an embodiment, the substrate 16 may be doped (e.g., heavily doped) with a concentration of an n-type dopant (e.g., arsenic or phosphorus) to provide n-type conductivity. The semiconductor layer 12 may be patterned by lithography and etching processes to define a multiple-sided shape, such as a rectangular shape. In an embodiment, the dielectric layer 14 may be a buried oxide layer of the layer stack of a germanium-on-insulator (GOI) substrate, the semiconductor layer 12 may be the device layer of a layer stack of the GOI substrate, and the substrate 16 may be the handle substrate of the layer stack of the GOI substrate.

A dielectric layer 18 may be formed over the semiconductor layer 12. The dielectric layer 18 may comprise a dielectric material, such as silicon dioxide. The dielectric layer 18 may be patterned by lithography and etching processes to define an opening that exposes a surface area of the semiconductor layer 12. The dielectric material of the dielectric layer 18 also fills the space over the dielectric layer 14 surrounding the patterned semiconductor layer 12.

An opening 20 may be formed that penetrates through the semiconductor layer 12 and the dielectric layer 14 to the substrate 16. The opening 20 may be formed at the location of the opening in the dielectric layer 18 by one or more etching processes with reliance on the dielectric layer 18 as an etch mask. The bottom of the opening 20 may be penetrate to a shallow depth into the substrate 16. A portion of the opening 20 is surrounded by the semiconductor layer 12. In an embodiment, the opening 20 may be centrally located in the semiconductor layer 12.

Figure 3:
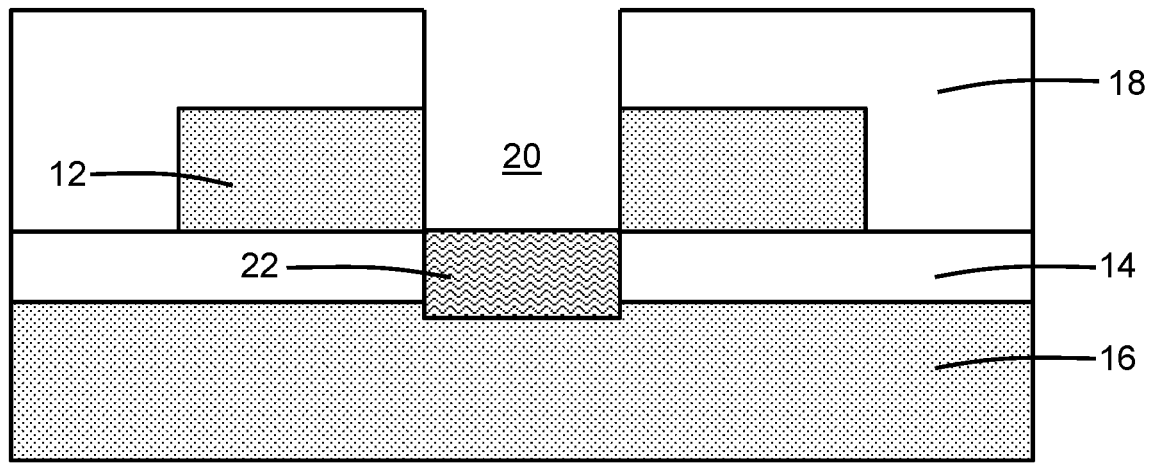
FIG. 3 is a cross-sectional view of the structure at a fabrication stage subsequent to FIG. 2.

With reference to FIG. 3 in which like reference numerals refer to like features in FIG. 2 and at a subsequent fabrication stage of the processing method, a semiconductor layer 22 may be formed inside the opening 20 on the substrate 16. The semiconductor layer 22 is comprised of a semiconductor material having a different composition than the semiconductor material of the semiconductor layer 12. In an embodiment, the semiconductor layer 22 may be comprised of a single-crystal semiconductor material, such as single-crystal silicon. In an embodiment, the semiconductor layer 22 may be undoped and intrinsic following its formation. The semiconductor layer 22 may be formed by an epitaxial growth process. The epitaxial growth process forming the semiconductor layer 22 may be selective in that the single-crystal semiconductor material is permitted to grow from semiconductor material (e.g., the substrate 16) but not from dielectric material (e.g., the dielectric layer 18). The semiconductor layer 22 includes a lower portion below the interface between the dielectric layer 14 and the substrate 16, and the semiconductor layer 22 includes an upper portion above the interface between the dielectric layer 14 and the substrate 16. The semiconductor material constituting the semiconductor layer 22 may be characterized by a different bandgap (e.g., a wider bandgap) than the semiconductor material of the semiconductor layer 12.

Figure 4:
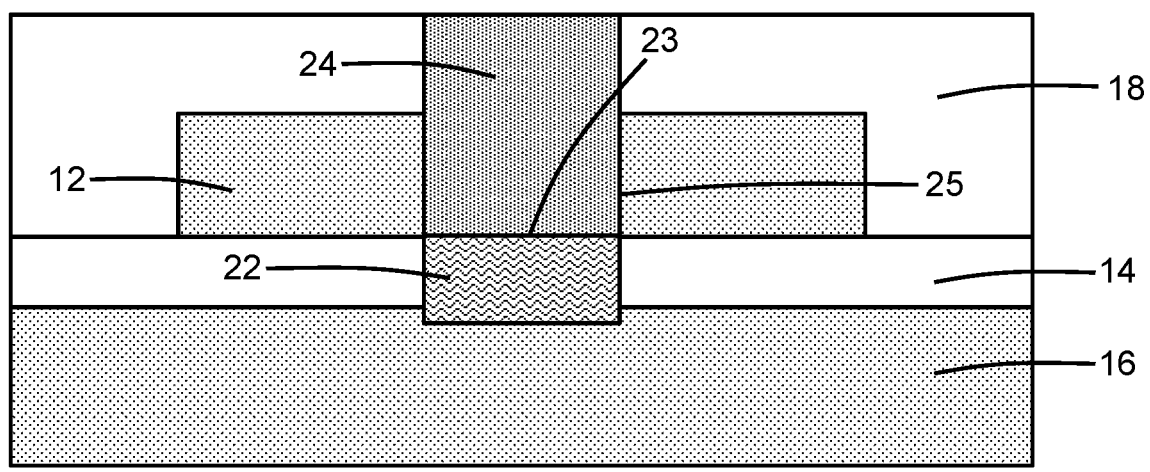
FIG. 4 is a cross-sectional view of the structure at a fabrication stage subsequent to FIG. 3.

With reference to FIG. 4 in which like reference numerals refer to like features in FIG. 3 and at a subsequent fabrication stage of the processing method, a semiconductor layer 24 may be formed inside the opening 20 on the semiconductor layer 22. The semiconductor layer 24 is comprised of a semiconductor material having a different composition than the semiconductor layer 12. The semiconductor layer 24 may include a lower portion that is surrounded by, and adjoins, the semiconductor layer 12, as well as an upper portion that projects above the semiconductor layer 12. The semiconductor layer 24 is arranged in a vertical layer stack that also includes the semiconductor layer 22.

The semiconductor layer 24 may be comprised of a single-crystal semiconductor material, such as single-crystal silicon. The semiconductor layer 24 may be formed by an epitaxial growth process. The epitaxial growth process forming the semiconductor layer 24 may be selective in that the single-crystal semiconductor material is permitted to grow from semiconductor material (e.g., the semiconductor layer 22) but not from dielectric material (e.g., the dielectric layer 18). In an embodiment, the semiconductor layer 24 may contain a p-type dopant (e.g., boron) that provides p-type conductivity, which may be provided in-situ during epitaxial growth. In an embodiment, the semiconductor layer 24 may be heavily doped by the p-type dopant. The semiconductor material constituting the semiconductor layer 24 may be characterized by a different bandgap (e.g., a wider bandgap) than the semiconductor material of the semiconductor layer 12. The semiconductor layers 22, 24 and the substrate 16 may define a vertical p-i-n diode that is embedded within the construction of structure 10 for the avalanche photodetector.

The semiconductor layer 24 adjoins the semiconductor layer 22 along an interface 23 across which at least the conductivity type of the semiconductor material changes, and the semiconductor layer 24 adjoins the semiconductor layer 12 along an interface 25 across which the composition of the semiconductor material changes. The interface 23 defines a plane that is not parallel to the plane defined by the interface 25 but that is instead angled relative to the plane defined by the interface 25 consistent with the combined lateral and vertical arrangement for the avalanche photodiode. In an embodiment, the plane defined by the interface 23 may be orthogonal or substantially orthogonal to the plane defined by the interface 25. In an embodiment, the semiconductor layer 22 and/or the semiconductor layer 24 may be etched back for height control of the semiconductor layer 24. In an embodiment, a rapid thermal anneal in an oxygen-containing atmosphere may be performed to provide a trap-reduction treatment for the interface 25 between the semiconductor layer 12 and the semiconductor layer 24.

Figure 5:
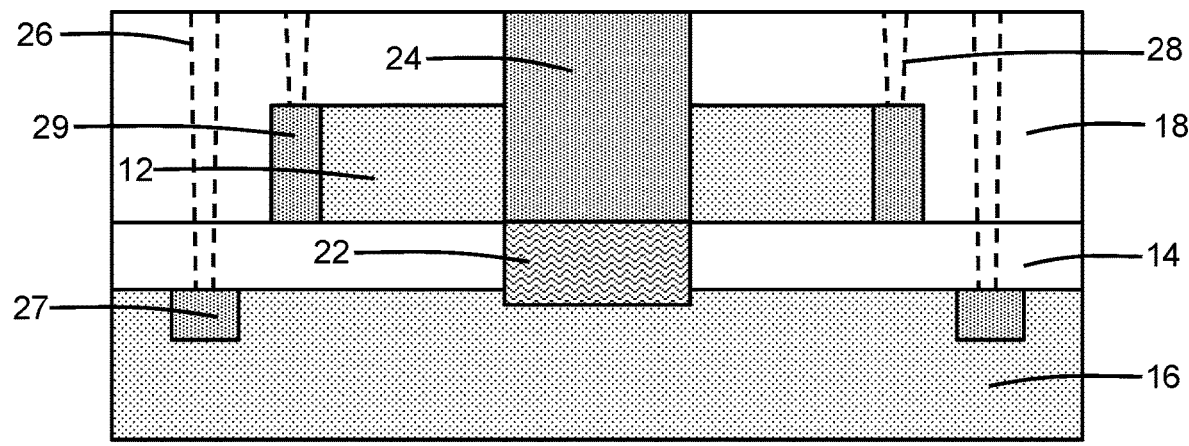
FIG. 5 is a cross-sectional view of the structure at a fabrication stage subsequent to FIG. 4.

With reference to FIG. 5 in which like reference numerals refer to like features in FIG. 4 and at a subsequent fabrication stage of the processing method, contacts 26 are formed that are electrically and physically connected to doped regions 27 in the substrate 16. Contacts 28 are formed that are electrically and physically connected to doped regions 29 in respective side edge portions of the semiconductor layer 12. The contacts 26 may be formed in contact openings patterned in the dielectric layer 14 and the dielectric layer 18, and the doped regions 27 may be formed in the substrate 16 after forming the contact openings and before forming the contacts 26. The contacts 28 may be formed in contact openings patterned in the dielectric layer 18, and the doped regions 29 may be formed in the side edge portions of the semiconductor layer 12 after forming the contact openings and before forming the contacts 28. The contacts 26, 28 may be comprised of a metal, such as tungsten. In an embodiment, the contacts 26 may be formed separately from the contacts 28. In an embodiment, the substrate 16 may supply a cathode of the avalanche photodetector, and the semiconductor layer 12 may supply an anode of the avalanche photodetector. Photoelectrons may flow in the avalanche photodetector from the anode to the cathode.

In use, the avalanche photodetector may be biased close to the breakdown voltage. Incident radiation is absorbed in the absorption region of the avalanche photodetector defined by the semiconductor layer 12, and signal amplification occurs in the multiplication region defined by the semiconductor layer 22. When photons are absorbed in the absorption region, electron-hole pairs are created, and the photoelectrons diffuse laterally from the absorption region to the semiconductor layer 24. The semiconductor layer 24 defines a charge control region that is used to control the electric field in the multiplication and absorption regions, and to reduce the after-pulsing effect. An avalanche current is generated in the multiplication region by the creation of additional electron-hole pairs through impact ionization. The collected avalanche current provides a detectable electronic signal that can be output from the avalanche photodetector in a current path through the contacts 26, 28.

The absorption region provided by the semiconductor layer 12 and the charge control region provided by the semiconductor layer 24 have a horizontal or lateral arrangement. The multiplication region provided by the semiconductor layer 22, the charge control region provided by the semiconductor layer 24, and the substrate 16 have a vertical arrangement. The absorption region wraps around the vertically-arranged charge control and multiplication regions. The distinct separation of the laterally-arranged absorption region and the vertically-arranged charge control and multiplication regions may reduce the dark current and control after-pulsing without compromising the photodetection efficiency of the avalanche photodetector. The avalanche photodetector may be utilized in applications detecting short wavelength infrared radiation. The lateral arrangement of the semiconductor layer 12 relative to the semiconductor layer 24 may enhance the fill factor such that the absorption region is larger than the charge control region for improved photodetection efficiency compared with a conventional avalanche photodetector in which the absorption and charge control regions are vertically stacked. The semiconductor layer 22 provides a multiplication region with a confined volume that may be effective to reduce jitter in comparison with a conventional avalanche photodetector.

Figure 6:
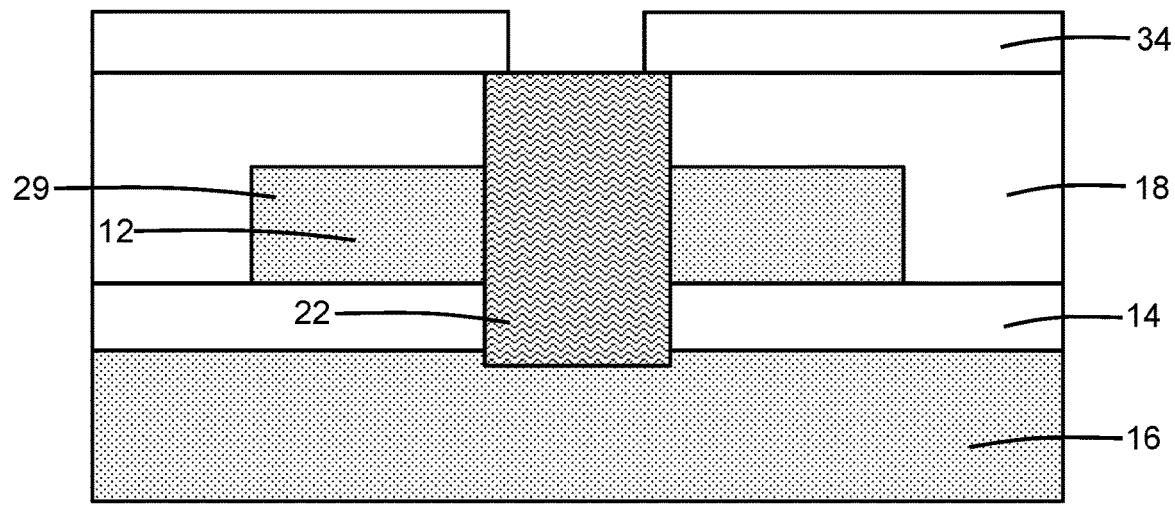
FIG. 6 is a cross-sectional view of a structure at a fabrication stage of a processing method in accordance with alternative embodiments of the invention.

With reference to FIG. 6 and in accordance with alternative embodiments, the semiconductor layer 22 may be formed with a larger thickness. In an embodiment, the semiconductor layer 22 may fully fill the opening 20. An implantation mask 34 may be formed that includes an opening over a portion of the semiconductor layer 22. In an embodiment, the opening in the implantation mask 34 may be centrally located over the semiconductor layer 22.

Figure 7:
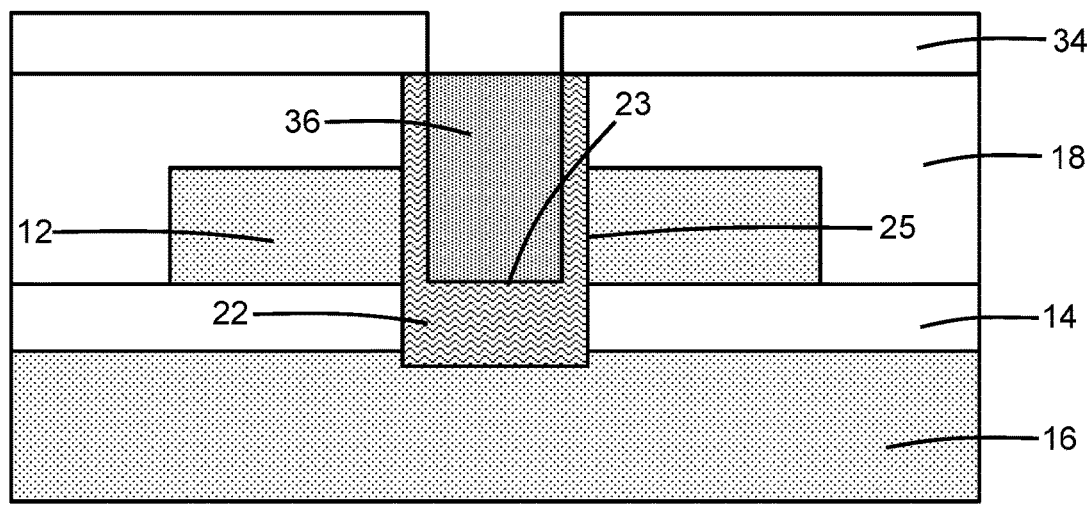
FIG. 7 is a cross-sectional view of the structure at a fabrication stage subsequent to FIG. 6.

With reference to FIG. 7 in which like reference numerals refer to like features in FIG. 6 and at a subsequent fabrication stage, a doped region 36 may be formed in the semiconductor layer 22. The doped region 36 may be narrower than the semiconductor layer 22 due to the sizing of the opening in the implantation mask 34 and, as a consequence, a portion of the intrinsic semiconductor material of the semiconductor layer 22 may be laterally positioned between the doped region 36 and the surrounding semiconductor layer 12. The doped region 36 extends in depth over a portion of the thickness of the semiconductor layer 22. An undoped portion of the semiconductor layer 22 is located between the doped region 36 and the substrate 16. The doped region 36 provides the charge control region of the avalanche photodetector, and the undoped portion of the semiconductor layer 22 provides the multiplication region of the avalanche photodetector.

In an embodiment, the doped region 36 may be formed by, for example, a ion implantation process using the implantation mask 34. The implantation conditions (e.g., ion species, dose, kinetic energy) may be selected to tune the electrical and physical characteristics of the doped region 36. The implantation mask 34, which has a thickness adequate to stop the ions, may be stripped after forming the doped region 36. In an embodiment, the doped region 36 may receive and contain a p-type dopant (e.g., boron) that provides p-type conductivity. In an embodiment, the doped region 36 may be heavily doped by the p-type dopant.

Figure 8:
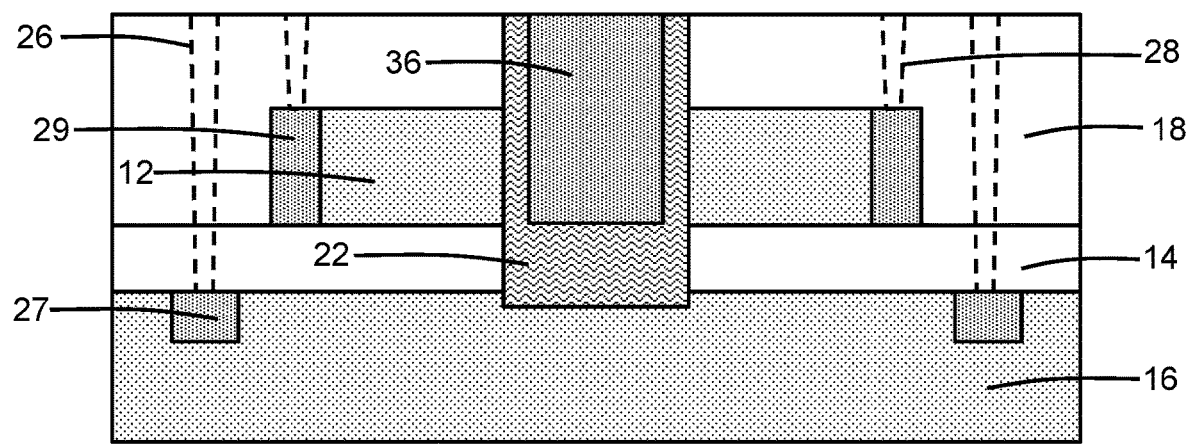
FIG. 8 is a cross-sectional view of the structure at a fabrication stage subsequent to FIG. 7.

With reference to FIG. 8 in which like reference numerals refer to like features in FIG. 7 and at a subsequent fabrication stage, the implantation mask 34 may be removed, and the contacts 26, 28 may be formed. The charge control region provided by the doped region 36 is positioned over a portion of the semiconductor layer 22 and is also surrounded by a portion of the semiconductor layer 22. Spacing the doped region 36 from the dielectric layer 14 and from the interface 25 may contribute to reducing recombination of the photoelectrons generated during use.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for an avalanche photodetector, the structure comprising:
   a substrate having a first conductivity type;
   a first semiconductor layer that defines an absorption region of the avalanche photodetector;
   a first contact connected to the substrate;
   a second contact connected to a side edge portion of the first semiconductor layer;
   a dielectric layer between the first semiconductor layer and the substrate;
   a charge control region comprising a semiconductor material having a second conductivity type opposite to the first conductivity type and a different bandgap from the first semiconductor layer; and
   a second semiconductor layer that extends through the dielectric layer from the charge control region to the substrate,
   wherein the second semiconductor layer defines a multiplication region.

2. The structure of claim 1 wherein the first semiconductor layer is intrinsic germanium.

3. The structure of claim 1 wherein the second semiconductor layer is intrinsic silicon.

4. The structure of claim 1 wherein the semiconductor material is silicon, the first conductivity type is n-type, and the second conductivity type is p-type.

5. The structure of claim 1 wherein the charge control region is a third semiconductor layer including a first portion that is surrounded by the first semiconductor layer.

6. The structure of claim 5 wherein the first portion of the third semiconductor layer has a first interface with the first semiconductor layer and a second interface with the second semiconductor layer.

7. The structure of claim 6 wherein the first interface is oriented substantially orthogonal to the second interface.

8. The structure of claim 5 wherein the third semiconductor layer includes a second portion that projects above the first semiconductor layer.

9. The structure of claim 5 wherein the second semiconductor layer and the third semiconductor layer are arranged in a vertical layer stack.

10. The structure of claim 1 wherein the dielectric layer adjoins the substrate along an interface, and the second semiconductor layer includes a first portion arranged above the interface.

11. The structure of claim 10 wherein the second semiconductor layer includes a second portion arranged below the interface.

12. The structure of claim 1 wherein the charge control region is a doped region in the second semiconductor layer.

13. The structure of claim 12 wherein the second semiconductor layer includes a portion positioned between the doped region and the first semiconductor layer.

14. The structure of claim 13 wherein the portion of the second semiconductor layer surrounds the doped region.

15. The structure of claim 1 wherein the charge control region is surrounded by the first semiconductor layer.

16. The structure of claim 1 wherein the substrate, the dielectric layer, and the first semiconductor layer define a layer stack of a germanium-on-insulator substrate.

17. The structure of claim 1 wherein the semiconductor material is silicon, and the first semiconductor layer is intrinsic germanium.

18. A method of forming a structure for an avalanche photodetector, the method comprising:
    providing a substrate having a first conductivity type, a first semiconductor layer, and a dielectric layer between the first semiconductor layer and the substrate;
    patterning the first semiconductor layer to define an absorption region of the avalanche photodetector;
    forming a charge control region comprising a semiconductor material having a second conductivity type opposite to the first conductivity type and a different bandgap from the first semiconductor layer;
    forming a second semiconductor layer that extends through the dielectric layer from the charge control region to the substrate, wherein the second semiconductor layer defines a multiplication region of the avalanche photodetector;
    forming a first contact connected to the substrate; and
    forming a second contact connected to a side edge portion of the first semiconductor layer.

19. The method of claim 18 wherein forming the charge control region comprising the semiconductor material having the second conductivity type opposite to the first conductivity type comprises:
    epitaxially growing a third semiconductor layer on the second semiconductor layer.

20. The method of claim 18 wherein forming the charge control region comprising the semiconductor material having the second conductivity type opposite to the first conductivity type comprises:
    forming a doped region in the second semiconductor layer.

* * * * *